US007142572B2

(12) United States Patent
Tojo (10) Patent No.: US 7,142,572 B2
(45) Date of Patent: Nov. 28, 2006

(54) WAVELENGTH CONVERSION LASER APPARATUS WITH TUNABLE FIBER BRAGG GRATING

(75) Inventor: Koji Tojo, Sagamihara (JP)

(73) Assignee: Shimadzu Corporation, Kyoto (JP)

( * ) Notice: Subject to any disclaimer, the term of this patent is extended or adjusted under 35 U.S.C. 154(b) by 218 days.

(21) Appl. No.: 10/665,193

(22) Filed: Sep. 18, 2003

(65) Prior Publication Data

US 2004/0091004 A1    May 13, 2004

(30) Foreign Application Priority Data

Nov. 13, 2002  (JP) .............................. 2002-328946
Nov. 13, 2002  (JP) .............................. 2002-328979

(51) Int. Cl.
*H01S 3/10* (2006.01)
*H01S 3/13* (2006.01)

(52) U.S. Cl. ............................. 372/32; 372/20; 372/22; 372/102

(58) Field of Classification Search .................. 372/22, 372/102, 20, 32
See application file for complete search history.

(56) References Cited

U.S. PATENT DOCUMENTS

| 5,007,705 | A | * | 4/1991 | Morey et al. .................. 385/12 |
| 5,418,802 | A | * | 5/1995 | Chwalek ....................... 372/20 |
| 5,682,398 | A | * | 10/1997 | Gupta .......................... 372/22 |
| 5,845,030 | A | | 12/1998 | Sasaki et al. |
| 6,181,851 | B1 | * | 1/2001 | Pan et al. ...................... 385/37 |
| 6,470,036 | B1 | * | 10/2002 | Bailey et al. .................. 372/20 |
| 7,010,006 | B1 | * | 3/2006 | Kasazumi et al. ........ 372/29.02 |
| 2002/0009102 | A1 | * | 1/2002 | Hayakawa .................... 372/22 |
| 2003/0021535 | A1 | * | 1/2003 | Eldada et al. ................. 385/37 |

\* cited by examiner

*Primary Examiner*—Armando Rodriguez
*Assistant Examiner*—Marcia A. Golub
(74) *Attorney, Agent, or Firm*—Jordan and Hamburg LLP (57) ABSTRACT

A grating is provided in an optical fiber for adjusting the wavelength of an output light from the optical resonator which consists mainly of a semiconductor light emitting device and the optical fiber to be slightly shorter than a wavelength range of an input light where the wavelength range of an input light can be converted by a wavelength conversion device. As the grating is adjustably expanded with a knob control being turned, the wavelength of the output light from the optical resonator is modified to be matched with the wavelength range of the input light where the wavelength of the input light can be converted by the wavelength conversion device. Any change in the center wavelength of the input light wavelength range where the wavelength of the input light can be converted by the wavelength conversion device which results from a variation in the temperature can be counteracted by a heat-sensitive expandable lead screw expanding to increase the length of the grating in the optical fiber and thus adjust the wavelength of the output light from the optical resonator composed of the semiconductor light emitting device and the optical fiber.

2 Claims, 4 Drawing Sheets

WAVELENGTH CONVERSION LASER APPARATUS WITH TUNABLE FIBER BRAGG GRATING

FIELD OF THE INVENTION

The present invention relates to a Solid laser apparatus and more particularly to a wavelength conversion laser apparatus arranged for adjusting a wavelength of an output light released from an optical resonator to match with a wavelength range of an input light where the wavelength of the input light can be converted by a wavelength conversion device when the wavelength of the output light released from the optical resonator is not matched with the wavelength range of an input light where the wavelength of the input light can be converted by the wavelength conversion device. The invention also relates to a wavelength conversion laser apparatus arranged for maintaining its output stable regardless of a change in the temperature of its wavelength conversion device.

PRIOR ART

A laser module has been known which has an optical resonator composed of a semiconductor light emitting device and an optical fiber with a grating provided therein (for example, as disclosed in Japanese Patent Publication No.3120828).

Also, a technique is known in which while an optical fiber is secured by a heat-sensitive expandable member at two locations between which a grating is installed, the grating is driven by the heat-sensitive expandable member to expand and counteract a change in its refractive index which results from temperature variation, whereby the wavelength of light reflected from the grating can be maintained constant or substantially constant regardless of any change in the temperature (for example, as depicted in "Development of an optical fiber grating for a WDM system" by Ikuo Ohta et al., Furukawa Denko Proceeding Vol. 104, July 1999, pp. 63–68).

Moreover, a wavelength conversion device is known which releases a harmonic of the input light (for example, as disclosed in Japanese Patent Publication No. 3223648).

Accordingly, a wavelength conversion laser apparatus may be proposed which comprises the laser module of the Publication 3120828 and the wavelength conversion device of the Publication 3223648.

It may be contemplated that the wavelength conversion laser apparatus is provided with the technology depicted in "Development of an optical fibber grating for a WDM system" whereby the wavelength of an input light received by the wavelength conversion device can be maintained constant regardless of any change in the temperature.

However, while the wavelength range of the input light where the wavelength of the input light can be converted by the wavelength conversion device is as small as about 0.1 nm, the center wavelength of light reflected from the grating may be varied, due to an error in the manufacturing of the grating, greater than the wavelength range of the input light where the wavelength of the input light can be converted by the wavelength conversion device. As the result, the wavelength of the output light from the optical resonator will hardly be matched with the wavelength range of the input light where the wavelength of the input light can be converted by the wavelength conversion device, hence declining the yield of the wavelength conversion laser apparatus. In addition, the center wavelength of the input light received by the wavelength conversion device is varied with the temperature of the same. Moreover, the wavelength range of the input light where the wavelength of the input light can be converted by the wavelength conversion device is as small as about 0.1 nm. It is thus difficult to maintain the output of the wavelength conversion device constant when a change in the temperature of the wavelength conversion device occurs with a constant wavelength of the input light.

SUMMARY OF THE INVENTION

It is a primary object of the present invention to provide a wavelength conversion laser apparatus which can adjust a wavelength of an output light from an optical resonator to match with a wavelength range of an input light where the wavelength of the input light can be converted by a wavelength conversion device when the wavelength of the output light released from the optical resonator is not matched with the wavelength range of the input light where the wavelength of the input light can be converted by the wavelength conversion device.

It is a secondary object of the present invention to provide a wavelength conversion laser apparatus which can release its output maintained stable regardless of any change in the temperature of the wavelength conversion device.

As a first feature of the present invention, a wavelength conversion laser apparatus is provided comprising a semiconductor light emitting device, an optical fiber having a grating provided therein, a wavelength conversion device for receiving an input light from an optical resonator which consists mainly of the semiconductor light emitting device and the optical fiber and releasing a harmonic of the input light, and a grating expanding means for expanding the grating in its lengthwise direction to match the wavelength of the output light from the optical resonator with the wavelength range of the input light where the wavelength of the input light can be converted by the wavelength conversion device.

The wavelength L [m] of light reflected from the grating is expressed by:

$$L = 2 \ast n \ast D \qquad (1)$$

where n is the effective index of refraction of the grating and D [m] is the period of the grating. Accordingly, the wavelength L [m] of light reflected from the grating can be increased by expanding the grating and thus increasing its period D [m].

The wavelength conversion laser apparatus of the first feature allows the wavelength of the output light from the optical resonator to be forcefully elongated by expanding the grating in the lengthwise direction when it is shorter than the wavelength range of the input light where the wavelength of the input light can be converted by the wavelength conversion device, whereby the wavelength of the output light from the optical resonator can be adjusted to match with the wavelength range of the input light where the wavelength of the input light can be converted by the wavelength conversion device. Even though the grating creates a-variation in the center wavelength of light reflected therefrom due to its manufacturing error, its length can be expanded to forcefully elongate the wavelength of the output light released from the optical resonator and thus counteract the variation. As the result, the wavelength of the output light from the optical resonator can be adjusted to match with the wavelength of the input light received by the wavelength conversion device, hence improving the yield of the wavelength conversion laser apparatus. As a second feature of the present invention, the wavelength conversion laser apparatus described above may be modified in which the grating expanding means comprises a base having a first retainer provided for securing the optical fiber, a movable nut arranged for slidably moving on the base and having a second retainer provided for securing the optical fiber, a lead screw threaded with the movable nut, and a rotating means for rotating the lead screw.

The wavelength conversion laser apparatus of the second feature allows the grating to be expanded in the lengthwise direction by the lead screw being turned when the wavelength of the output light from the optical resonator fails to match with the wavelength range of the input light where the wavelength of the input light can be converted by the wavelength conversion device. Accordingly, the wavelength of the output light from the optical resonator can forcefully be adjusted to match with the wavelength range of the input light where the wavelength of the input light can be converted by the wavelength conversion device.

As a third feature of the present invention, the wavelength conversion laser apparatus described above may be modified in which the grating expanding means comprises a bar-like heat-sensitive expandable member for securing the optical fiber at two locations between which the grating is installed and a heating means for heating the heat-sensitive expandable member to increase the distance including the grating between the two locations.

The wavelength conversion laser apparatus of the third feature allows the grating to be expanded in the lengthwise direction by heating and elongating the heat-sensitive expandable member when the wavelength of the output light from the optical resonator fails to match with the wavelength range of the input light where the wavelength of the input light can be converted by the wavelength conversion device. Accordingly, the wavelength of the output light from the optical resonator can forcefully be adjusted to match with the wavelength range of the input light where the wavelength of the input light can be converted by the wavelength conversion device.

As a fourth feature of the present invention, the wavelength conversion laser apparatus described above may be modified in which the heat-sensitive expandable member comprises two or more materials which are different in the linear expansion coefficient and are bonded to each other.

The wavelength conversion laser apparatus of the fourth feature allows the linear expansion coefficient to be set to a desired level because of a combination of the two materials, such as stainless steel and copper, which are different in the linear expansion coefficient.

As a fifth feature of the present invention, the wavelength conversion laser apparatus described above may be modified in which the grating expanding means comprises a heat-sensitive expandable member of a ring or disk shape having an outer side thereof arranged on which a portion of the optical fiber including the grating is wound and a heating means for heating the heat-sensitive expandable member to expand the outer side. The wavelength conversion laser apparatus of the fifth feature allows the optical fiber to be protected from receiving any unwanted local stress.

As a sixth feature of the present invention, the wavelength conversion laser apparatus described above may be modified in which the grating expanding means comprises a bar-like piezoelectric member arranged to secure the optical fiber at two locations between which the grating is installed and a voltage impressing means for supplying the piezoelectric member with a voltage to increase the distance between the two locations.

The wavelength conversion laser apparatus of the sixth feature allows the grating to be expanded in the lengthwise direction by applying with a voltage and elongating the piezoelectric member when the wavelength of the output light from the optical resonator fails to match with the wavelength range of the input light where the wavelength of the input light can be converted by the wavelength conversion device. Accordingly, the wavelength of the output light from the optical resonator can forcefully be adjusted to match with the wavelength range of the input light where the wavelength of the input light can be converted by the wavelength conversion device.

As a seventh feature of the present invention, a wavelength conversion laser apparatus is provided comprising a semiconductor light emitting device, an optical fiber having a grating provided therein, a wavelength conversion device for receiving an input light from an optical resonator which consists mainly of the semiconductor light emitting device and the optical fiber and releasing a harmonic of the input light, and a resonant wavelength adjusting means for adjusting the wavelength of the light from the optical resonator in accordance with the temperature so as to maintain the harmonic of the light from the wavelength conversion device constant or substantially constant regardless of a change in the temperature of the wavelength conversion device.

The wavelength conversion laser apparatus of the seventh feature allows the wavelength of the output light from the optical resonator to be adjusted to counteract any change, which may result from temperature variation in the wavelength conversion device, in the center wavelength of the input light range where the wavelength of the input light can be converted by the wavelength conversion device, hence maintaining its output stable regardless of any change in the temperature.

As an eighth feature of the present invention, the wavelength conversion laser apparatus described above may be modified in which the resonant wavelength adjusting means is a grating expanding means for expanding the grating in its lengthwise direction.

The wavelength conversion laser apparatus of the eighth feature allows the grating to be expanded in the lengthwise direction by the grating expanding means in response to a change in the temperature of the wavelength conversion device. Accordingly, the wavelength of the output light from the optical resonator can be adjusted to counteract a change in the center wavelength of the input light range where the wavelength of the input light can be converted by the wavelength conversion device.

As a ninth feature of the present invention, the wavelength conversion laser apparatus described above may be modified in which the grating expanding means is a bar-like heat-sensitive expandable member which secures the optical fiber at two locations between which the grating is located.

The wavelength conversion laser apparatus of the ninth feature allows the grating expanding means to be decreased in the overall size. As a tenth feature of the present invention, the wavelength conversion laser apparatus described above may be modified in which the grating expanding means is a heat-sensitive expandable member of a ring or disk shape having an outer side thereof arranged on which a portion of the optical fiber including the grating is wound.

The wavelength conversion laser apparatus of the tenth feature allows the optical fiber to be protected from receiving any unwanted local stress.

As an eleventh feature of the present invention, the wavelength conversion laser apparatus described above may be modified in which the heat-sensitive expandable member has a linear expansion coefficient of $5*10^{-5}$ $[K^{-1}]$–$6*10^{-5}$ $[K^{-1}]$.

Assuming that the wavelength of the input light at a wavelength ranging from 900 [nm] to 1100 [nm] released from the optical resonator can be converted by the wavelength conversion device which has an optical waveguide made of a nonlinear optical crystal such as lithium niobate, lithium tantalate, or their MgO doped form, the thermally changing rate of the wavelength of the input light which can be converted by the wavelength conversion device is substantially 0.06 [nm/K]. It is then desired that the thermally changing rate of the output light released from the optical resonator is substantially 0.06 [nm/K].

The wavelength L [m] of light reflected from the grating is expressed by:

$$L = 2*n*D \quad (1)$$

where n is the effective index of refraction of the grating and D [m] is the period of the grating. Then, the thermally changing rate $\partial L/\partial T$ of the wavelength L of light reflected from the grating is calculated from:

$$\frac{\partial L}{\partial T} = 2*\left(D*\frac{\partial n}{\partial T} + n*\frac{\partial D}{\partial T}\right) \quad (2)$$

$$= 2*n*D\left\{\left(\frac{1}{n}\right)\left(\frac{\partial n}{\partial T}\right) + \left(\frac{1}{D}\right)\left(\frac{\partial D}{\partial T}\right)\right\}$$

Then, when the linear expansion coefficient of the grating is A, established is $$A = (1/D)(\partial D/\partial T) \quad (3)$$

Therefore, using the equations (1), (2), and (3), the thermally changing rate is expressed as:

$$\partial L/\partial T = L*\{(1/n)(\partial n/\partial T) + A\} \quad (4)$$

By substituting the thermally changing rate $\partial L/\partial T$ of the wavelength $\partial L/\partial T = 0.06$ [nm/K], the wavelength L=1000 nm, the effective index of refraction n=1.5, and the temperature coefficient $\partial n/\partial T$ of the effective index of refraction $\partial n/\partial T = 9*10^{-6}$ $[K^{-1}]$ in the equation (4), the linear expansion coefficient A is:

$$A = 54*10^{-6} [K^{-1}]$$

The wavelength conversion laser apparatus of the eleventh feature allows the heat-sensitive expandable member to have a linear expansion coefficient of $5*10^{-5}$ $[K^{-1}]$–$6*10^{-5}$ $[K^{-1}]$. Since the grating which collaborates with the heat-sensitive expandable member is equal in the linear expansion coefficient to the heat-sensitive expandable member, it can substantially match the linear expansion coefficient A. As the result, the wavelength of the output light released from the optical resonator can be matched in the thermally changing rate with the wavelength range of the input light where the wavelength of the input light can be converted by the wavelength conversion device.

As a twelfth feature of the present invention, the wavelength conversion laser apparatus described above may be modified in which the heat-sensitive expandable member is made of a plastic material.

The wavelength conversion laser apparatus of the twelfth feature allows the linear expansion coefficient to be set to a desired level with the use of a plastic material selected from ABS resin, PPS resin, PBT resin, liquid crystal polymer, epoxy resin, and their additive doped materials.

As a thirteenth feature of the present invention, the wavelength conversion laser apparatus described above may be modified in which the heat-sensitive expandable member comprises two or more materials which are different in the linear expansion coefficient and are bonded to each other.

The wavelength conversion laser apparatus of the thirteenth feature allows the linear expansion coefficient to be set to a desired level with the use of a combination of two materials, such as stainless steel and copper, which are different in the linear expansion coefficient.

DETAILED DESCRIPTION OF THE PREFERRED

Embodiments

Some embodiments of the present invention will be described referring to the relevant drawings. It would however be understood that the present invention is not limited to the embodiments.

(First Embodiment)

Figure 1:
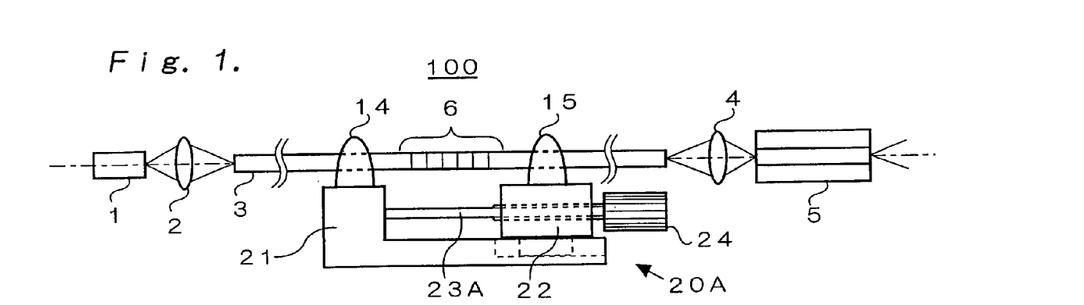
FIG. 1 is a schematic view of a wavelength conversion laser apparatus showing a first embodiment of the present invention.

A wavelength conversion laser apparatus 100 comprises an optical amplifier semiconductor device 1 having a function for generating and amplifying a light through feeding a space between the light reflecting side and the light emitting side with a current, a lens 2 for converging the light emitted from the optical amplifier semiconductor device 1, an optical fiber 3 having a grating 6 installed therein, a lens 4 for converging the light emitted from the optical fiber 3, a wavelength conversion device 5 for emitting a second harmonic light of the input light, and a grating expanding mechanism 20A having a first retainer 14 and a second retainer 15 for fixedly securing the optical fiber 3 at two locations between which the grating 6 is installed.

The optical fiber 3 is fixedly secured by adhesive bonding or soldering to the first retainer 14 and the second retainer 15.

The optical amplifier semiconductor device 1 and the optical fiber 3 constitute an optical resonator. In action, the light emitted from the optical amplifier semiconductor device 1 is converged by the lens 2 and received by a core at the input end of the optical fiber 3.

The input light received by the core of the optical fiber 3 is reflected at a specific wavelength determined by the grating 6 and returned back to the optical amplifier semiconductor device 1 where it is amplified before released and received again by the core of the optical fiber 3. This is repeated and finally the light at the specific wavelength determined by the grating 6 is released from the core at the output end of the optical fiber 3.

The light released from the core at the output end of the optical fiber 3 is then converged by the lens 4 and received by one end of the optical waveguide in the wavelength conversion device 5 where it is converted into a second harmonic which is then released from the other end of the optical waveguide.

The grating expanding mechanism 20A comprises a base 21, a movable nut 22 arranged for slidably moving on the base 21, a lead screw 23A treaded with the movable nut 22, and a driving unit 24 for rotating the lead screw 23A using a hand or a tool. The first retainer 14 is mounted to the base 21 while the second retainer 15 is mounted to the movable nut 22.

As the lead screw 23A is rotated with the driving unit 24, the movable nut 22 slides on and along the base 21 to change the distance between the first retainer 14 and the second retainer 15. Accordingly, the grating 6 expands to shift the wavelength of the light reflected from the grating 6 or the wavelength of a light released from the optical resonator.

The optical fiber 3 can be expanded with no external force being applied but hardly be contracted.

For compensation, the grating 6 is preset so that the wavelength of the light released from the optical resonator is slightly shorter than the wavelength range where the wavelength of the input light can be converted by the wavelength conversion device 5. By the grating 6 being expanded with the driving unit 24, the wavelength of the light released from the optical resonator can be adjusted to a length convertible in the wavelength conversion device 5.

This allows the output light released from the optical resonator to be matched in the wavelength range where the wavelength of the input light can be converted by the wavelength conversion device 5, regardless of unwanted variations in the center wavelength of the reflection light from the grating 6 which may result from manufacturing errors in the grating 6. Accordingly, the manufacturing efficiency of the apparatus can be improved.

(Second Embodiment)

Figure 2:
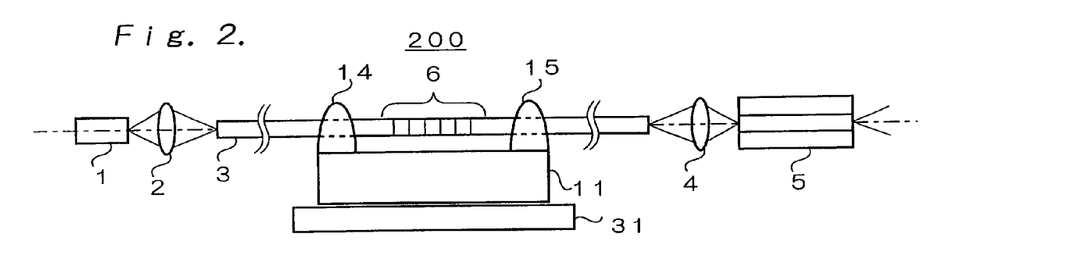
FIG. 2 is a schematic view of a wavelength conversion laser apparatus showing a second embodiment of the present invention.

A wavelength conversion laser apparatus 200 shown in FIG. 2 is provided in which the grating expanding mechanism 20 in the wavelength conversion laser apparatus 100 of the first embodiment is replaced by a combination of a heat-sensitive expandable member 11 and a heater 31.

The first retainer 14 and the second retainer 15 to which the optical fiber 3 is fixedly secured by adhesive bonding or soldering is joined to the heat-sensitive expandable member 11.

The heat-sensitive expandable member 11 may be made of a plastic material selected from ABS resin, PPS resin, PBT resin, liquid crystal polymer, epoxy polymer, and their additive doped plastic materials having a desired level of the linear expansion coefficient.

The heater 31 is thermally controlled. With the optical fiber 3 being urged by no external stress, the grating 6 is preset so that the wavelength of the output light released from the optical resonator is slightly shorter than the wavelength range where the wavelength of the input light can be converted by the wavelength conversion device 5. When the heat-sensitive expandable member 11 is heated by the heater 31, it expands to increase the distance between the first retainer 14 and the second retainer 15. This increases the length of the grating 6 thus allowing the wavelength of the output light from the optical resonator to be matched with the wavelength range where the wavelength of the input light can be converted by the wavelength conversion device 5.

(Third Embodiment)

Figure 3:
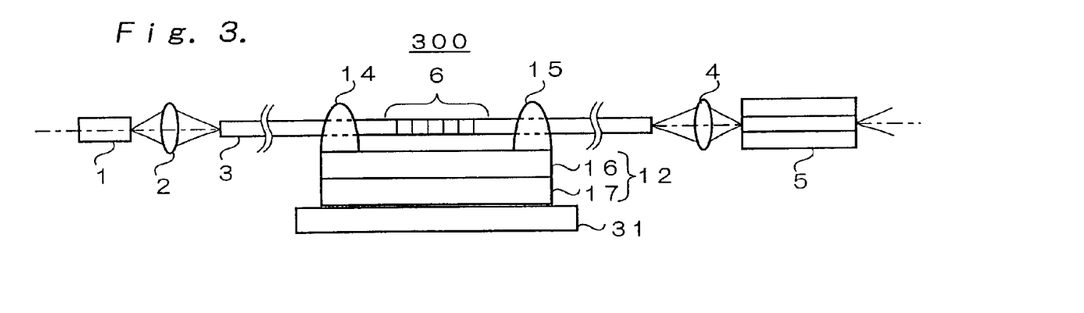
FIG. 3 is a schematic view of a wavelength conversion laser apparatus showing a third embodiment of the present invention.

A wavelength conversion laser apparatus 300 shown in FIG. 3 is provided in which the heat-sensitive expandable member 11 in the wavelength conversion laser apparatus 200 of the second embodiment is replaced by another heat-sensitive expandable member 12 which consists of two different linear expansion coefficient materials 16 and 17 bonded to each other to have a desired level of the linear expansion coefficient.

The heat-sensitive expandable member 12 is arranged in which the material 17 located further from the optical fiber 3 is smaller in the linear expansion coefficient than the other material 16 located close to the optical fiber 3. For example, the material 16 is copper while the material 17 is stainless steel, both forming a bimetal structure. Alternatively, a bimetal structure may be provided where the material 16 is aluminum and the material 17 is stainless steel.

As described, the wavelength conversion laser apparatus 300 like the wavelength conversion laser apparatus 200 of the second embodiment allows the wavelength of the output light from the optical resonator to be matched with the wavelength range where the wavelength of the input light can be converted by the wavelength conversion device 5.

(Fourth Embodiment)

Figure 4:
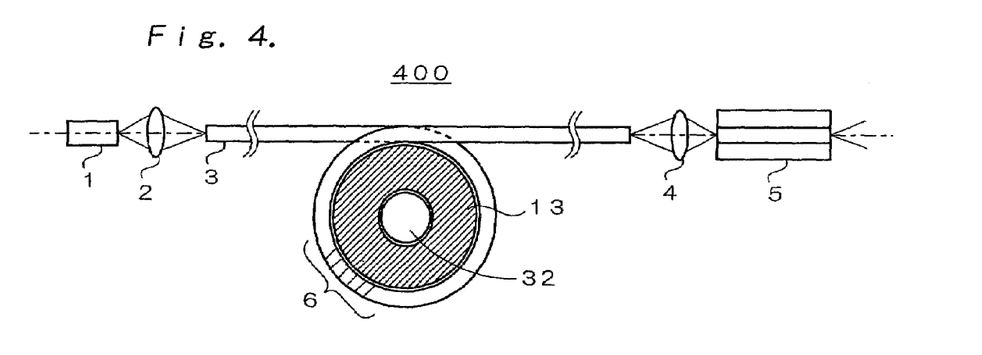
FIG. 4 is a schematic view of a wavelength conversion laser apparatus showing a fourth embodiment of the present invention.

A wavelength conversion laser apparatus 400 shown in FIG. 4 is provided in which the heat-sensitive expandable member 11 and the heater 31 in the wavelength conversion laser apparatus 200 of the second embodiment are replaced by an annular heat-sensitive expandable member 13 and a heater 32 provided in the annular shape. More specifically, a portion of the optical fiber 3 including the grating 6 is wound on the outer side of the annular heat-sensitive expandable member 13. Alternatively, the heat-sensitive expandable member 13 may be arranged of a disk shape to which the heater 32 is coupled.

The annular heat-sensitive expandable member 13 may be made of one of the plastic materials described with the second embodiment.

When the annular heat-sensitive expandable member 13 is heated by the heater 32, it expands at the outer side. This increases the wound portion of the optical fiber 3 including the grating 6. Accordingly, the wavelength of the output light from the optical resonator can be adjusted to match with the wavelength range where the wavelength of the input light can be converted by the wavelength conversion device 5.

(Fifth Embodiment)

Figure 5:
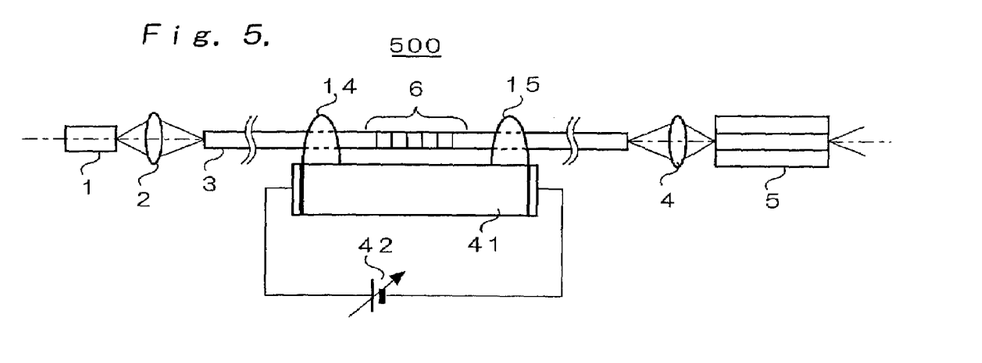
FIG. 5 is a schematic view of a wavelength conversion laser apparatus showing a fifth embodiment of the present invention.

A wavelength conversion laser apparatus 500 shown in FIG. 5 is provided in which the heat-sensitive expandable member 11 and the heater 31 in the wavelength conversion laser apparatus 200 of the second embodiment are replaced by a bar-like piezoelectric member 41 and a voltage impressing device 42 for applying a voltage to expand the piezoelectric member 41.

When the piezoelectric member 41 is supplied with a voltage by the voltage impressing device 42, it expands in a direction of the voltage application due to the longitudinal effect of inverse piezoelectric action. This increases the length of a portion of the optical fiber 3 including the grating 6. Accordingly, the wavelength of the output light from the optical resonator can be adjusted to match with the wavelength range where the wavelength of the input light can be converted by the wavelength conversion device 5.

(Sixth Embodiment)

Figure 6:
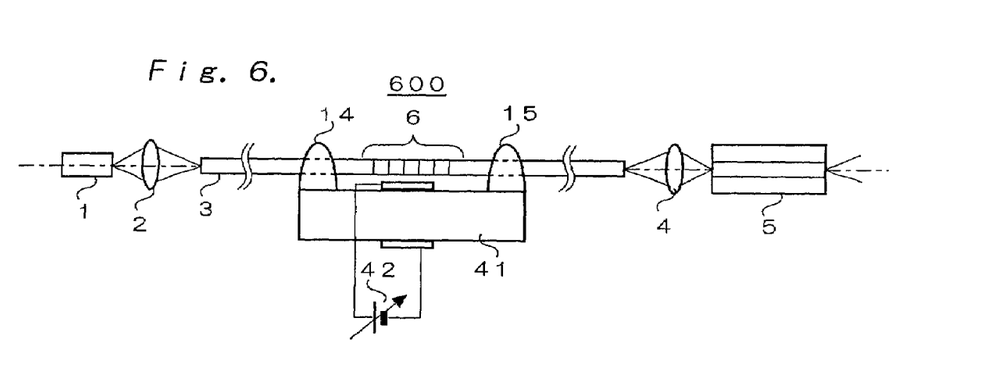
FIG. 6 is a schematic view of a wavelength conversion laser apparatus showing a sixth embodiment of the present invention.

A wavelength conversion laser apparatus 600 shown in FIG. 6 is substantially identical in the arrangement to the wavelength conversion laser apparatus 500 of the fifth embodiment. In particular, the piezoelectric member 41 can be expanded by the transversal effect of inverse piezoelectric action in a direction orthogonal to the voltage applying direction.

(Seventh Embodiment)

Figure 7:
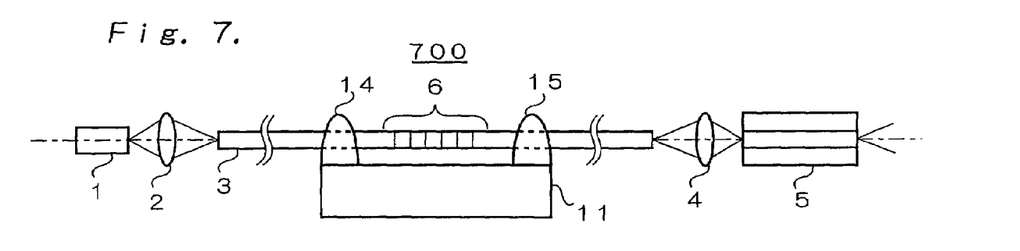
FIG. 7 is a schematic view of a wavelength conversion laser apparatus showing a seventh embodiment of the present invention.

A wavelength conversion laser apparatus 700 shown in FIG. 7 comprises an optical amplifier semiconductor device 1 for feeding a current to a space between the light reflecting side and the light emitting side to generate and amplify a beam of light, a lens 2 for converging the light emitted from the optical amplifier semiconductor device 1, an optical fiber 3 having a grating 6 provided therein, a lens 4 for converging the light released from the optical fiber 3, and a wavelength conversion device 5 for releasing second harmonic of the input light, and a bar-like heat-sensitive expandable member 11 having a first retainer 14 and a second retainer 15 arranged for fixedly securing the optical fiber 3 at two locations between which the grating 6 is installed. The wavelength conversion device 5 and the heat-sensitive expandable member 11 are adapted to be equal in the temperature.

The optical fiber 3 is fixedly secured by adhesive bonding or soldering to the first retainer 14 and the second retainer 15.

The optical amplifier semiconductor device 1 and the optical fiber 3 constitute an optical resonator. In action, the light released from the optical amplifier semiconductor device 1 is converged by the lens 2 and received by a core at one end of the optical fiber 3. The light received by the core of the optical fiber 3 is reflected at a specific wavelength determined by the grating 6 and returned back to the optical amplifier semiconductor device 1 where it is amplified. The amplified light released again from the optical amplifier semiconductor device 1 is received by the core at one end of the optical fiber 3. This is repeated and finally, the light at the wavelength determined by the grating 6 is released from the core at the other end of the optical fiber 3.

The light released from the core at the output end of the optical fiber 3 is then converged by the lens 4 and received by one end of the optical waveguide in the wavelength conversion device 5 where it is converted into a second harmonic which is then released from the other end of the optical waveguide.

It is assumed that the light released from the optical resonator which has a wavelength ranging from 900 [nm] to 1100 [nm] is converted by the wavelength conversion device 5 which is arranged of a nonlinear optical crystal, such as lithium niobate, lithium tantalate, or their MgO doped form, subjected to inversion of the polarization at given periods in the direction of light propagation for quasi phase matching at the wavelength ranging from 900 [nm] to 1100 [nm] and equipped with an optical waveguide for transmission of the light at a single mode. Then, the heat-sensitive expandable member 11 is prepared to have a linear expansion coefficient of $5*10^{-5}$ [$K^{-1}$]–$6*10^{-5}$ [$K^{-1}$]. More specifically, the heat-sensitive expandable member 11 is made of a plastic material selected from ABS resin, PPS resin, PBT resin, liquid crystal polymer, epoxy resin, and their additive doped materials having a desired level of the linear expansion coefficient.

This allows the thermally changing rate of the output light released from the optical resonator to be matched with the thermally changing rate of the input light wavelength range where the wavelength of the input light can be converted by the wavelength conversion device 5.

More particularly, even if the center wavelength of the input lightwavelength range where the wavelength of the input light can be converted by the wavelength conversion device 5 is varied by the effect of a temperature change in the wavelength conversion device 5, its change can be counteracted by the grating 6 increasing its length and modifying the wavelength of the output light released from the optical resonator. Accordingly, the output of the wavelength conversion device 5 remains stable regardless of its temperature change.

(Eighth Embodiment)

Figure 8:
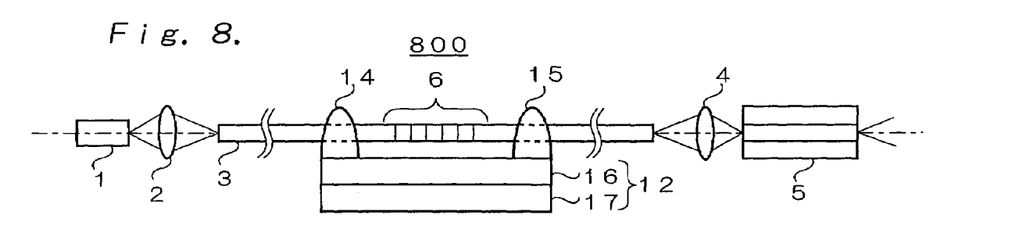
FIG. 8 is a schematic view of a wavelength conversion laser apparatus showing an eighth embodiment of the present invention.

A wavelength conversion laser apparatus 800 shown in FIG. 8 is provided in which the heat-sensitive expandable member 11 in the wavelength conversion laser apparatus 700 of the seventh embodiment is replaced by another heat-sensitive expandable member 12 which consists of two different linear expansion coefficient materials 16 and 17 bonded to each other to have a desired level of the linear expansion coefficient (based on the optical fiber 3).

The heat-sensitive expandable member 12 is arranged in which the material 17 located further from the optical fiber 3 is smaller in the linear expansion coefficient than the other material 16 located close to the optical fiber 3. For example, the material 16 is copper while the material 17 is stainless steel, both forming a bimetal structure. Alternatively, a bimetal structure may be provided where the material 16 is aluminum and the material 17 is stainless steel.

(Ninth Embodiment)

Figure 9:
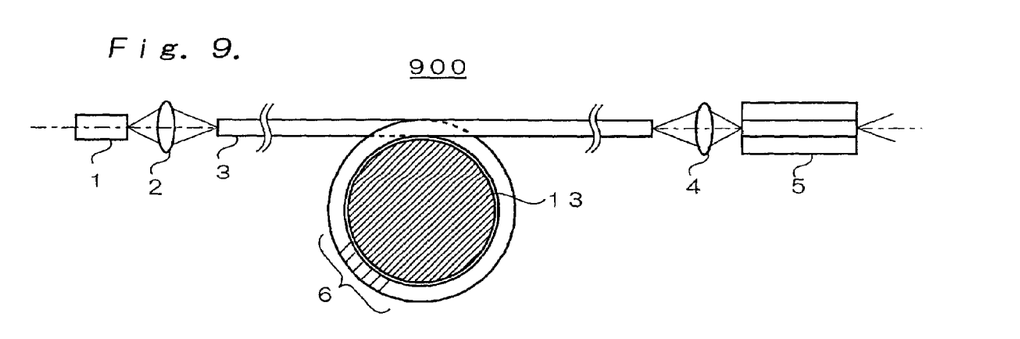
FIG. 9 is a schematic view of a wavelength conversion laser apparatus showing a ninth embodiment of the present invention.

A wavelength conversion laser apparatus 900 shown in FIG. 9 is provided in which the bar-like heat-sensitive expander member 11 in the wavelength conversion laser apparatus 700 of the seventh embodiment is replaced by a disk-shaped heat-sensitive expandable member 13. In particular, a portion of the optical fiber 3 including the grating 6 is wound on the outer side of the disk-shaped heat-sensitive expandable member 13. The heat-sensitive expandable member 13 may be arranged of an annular shape.

The heat-sensitive expandable member 13 may be made of a plastic material selected from those described with the seventh embodiment.

When the heat-sensitive expandable member 13 is expanded by heat, the portion of the optical fiber 3 including the grating 6 increases its length. This allows the thermally changing rate of the output light released from the optical resonator to be matched with the thermally changing rate of the input light wavelength range where the wavelength of the input $^{light}$ can be converted by the wavelength conversion device 5.

(Tenth Embodiment)

Figure 10:
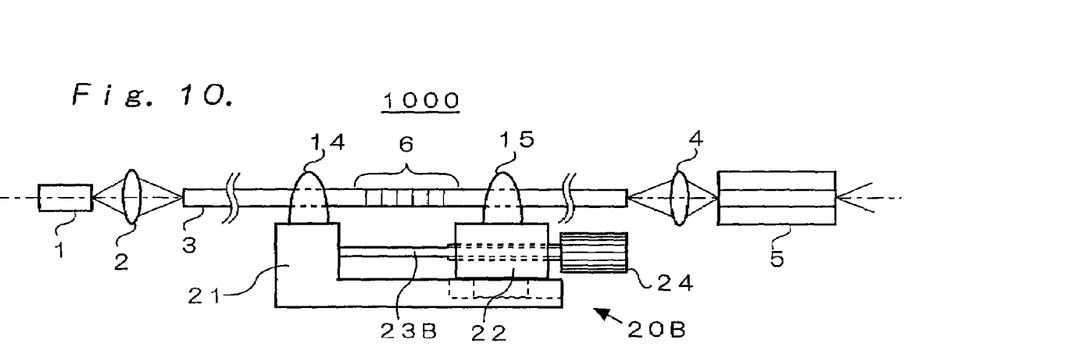
FIG. 10 is a schematic view of a wavelength conversion laser apparatus showing a tenth embodiment of the present invention.

A wavelength conversion laser apparatus 1000 shown in FIG. 10 is provided in which the bar-like heat-sensitive member 11 in the wavelength conversion laser apparatus 700 of the seventh embodiment is replaced by a manually adjustable heat-sensitive mechanism 20B.

The manually adjustable heat-sensitive mechanism 20B comprises a base 21, a movable nut 22 arranged for slidably moving on the base 21, a heat-sensitive expandable lead screw 23B treaded with the movable nut 22, and a driving unit 24 for rotating the heat-sensitive expandable lead screw 23B using a hand or a tool. A first retainer 14 is mounted to the base 21 while a second retainer 15 is mounted to the movable nut 22.

The heat-sensitive expandable lead screw 23B has a specific linear expansion coefficient and may be made of a plastic material selected from those described with the seventh embodiment.

The wavelength conversion device 5 and the heat-sensitive expandable lead screw 23B are arranged to be equal in the temperature.

As the heat-sensitive expandable lead screw 23B is rotated with the driving unit 24, the movable nut 22 slides on and along the base 21 to change the distance between the first retainer 14 and the second retainer 15. Accordingly, the grating 6 expands to shift the wavelength of the light reflected from the grating 6 or the wavelength of a light released from the optical resonator.

For compensation, the driving unit 24 is preset so that the wavelength of the light released from the optical resonator is equal to the wavelength range where the wavelength of the input light can be converted by the wavelength conversion device 5.

When the wavelength conversion device 5 is thermally stressed, the heat-sensitive expandable lead screw 23B expands to change the distance between the first retainer 14 and the second retainer 15. Accordingly, the thermally changing rate of the output light released from the optical resonator can be matched with the thermally changing rate of the input light wavelength range where the wavelength of the input light can be converted by the wavelength conversion device 5.

Moreover, the wavelength conversion laser apparatus 1000 allows the wavelength of the reflected light from the grating 6 to be modified by hand and can thus be handled with much ease.

What is claimed is:

1. A wavelength conversion laser apparatus, comprising:
a semiconductor light emitting device;
an optical fiber having a tunable Bragg grating provided therein and a fiber input end and a fiber output end;
an optical resonator formed of the semiconductor light emitting device arranged to input light into said optical fiber and receive reflected light from said optical fiber to effect a resonance at a resonance wavelength determined by a grating wavelength of said Bragg grating, said optical resonator providing optical resonator output light at said resonance wavelength at an output end of said optical fiber;
a wavelength conversion device formed of a nonlinear optical crystal formed from one of the group consisting of lithium niobate, lithium tantalate, MgO doped lithium niobate, and MgO doped lithium tantalate, and having a wavelength range for input light ranging from 900 nm to 1100 nm, said wavelength conversion device receiving as the input light said optical resonator output light from said optical resonator and releasing a harmonic of the input light;
a resonant wavelength adjusting means for adjusting the resonance wavelength of the optical resonator output light in accordance with temperature so as to maintain the harmonic of the light from the wavelength conversion device substantially constant regardless of a change in the temperature of the wavelength conversion device by substantially matching a temperature induced shift of said wavelength range for input light of said wavelength conversion device;
the resonant wavelenght adjusting means being a grating expanding means which is heat sensitive for expanding the tunable Bragg grating in a lengthwise direction of the tunable Bragg grating;
the grating expanding means being a bar-like heat-sensitive expandable member which secures the optical fiber at two locations between which the tunable Bragg grating is located, wherein the heat-sensitive expandable member has a linear expansion coefficient of $5*10^{-5}$ [K$^{-1}$]–$6*10^{-5}$ [K$^{-1}$].

2. A wavelength conversion laser apparatus, comprising:
a semiconductor light emitting device;
an optical fiber having a tunable Bragg grating provided therein and a fiber input end and a fiber output end;
an optical resonator formed of the semiconductor light emitting device arranged to input light into said optical fiber and receive reflected light from said optical fiber to effect a resonance at a resonance wavelength determined by a grating wavelength of said Bragg grating, said optical resonator providing optical resonator output light at said resonance wavelength at an output end of said optical fiber;
a wavelength conversion device formed of a nonlinear optical crystal formed from one of the group consisting of lithium niobate, lithium tantalate, MgO doped lithium niobate, and MgO doped lithium tantalate, and having a wavelength range for input light ranging from 900 nm to 1100 nm, said wavelength conversion device receiving as the input light said optical resonator output light from said optical resonator and releasing a harmonic of the input light;
a resonant wavelength adjusting means for adjusting the resonance wavelength of the optical resonator output light in accordance with temperature so as to maintain the harmonic of the light from the wavelength conversion device substantially constant regardless of a change in the temperature of the wavelength conversion device by substantially matching a temperature induced shift of said wavelength range for input light of said wavelength conversion device;
the resonant wavelength adjusting means being a grating expanding means which is heat sensitive for expanding die tunable Bragg grating in a lengthwise direction of the tunable Bragg rating; and
the grating expanding means being a bar-like heat-sensitive expandable member which secures the optical fiber at two locations between which the tunable Braag grating is located, wherein the heat-sensitive expandable member is made of a plastic material.

* * * * *